(12) United States Patent
Lai et al.

(10) Patent No.: US 10,043,578 B2
(45) Date of Patent: Aug. 7, 2018

(54) SENSE AMPLIFIER CIRCUITS (71) Applicant: MEDIATEK INC., Hsin-Chu (TW)

(72) Inventors: Shu-Lin Lai, Taichung (TW);
Shu-Hsuan Lin, Hsinchu (TW);
Shih-Huang Huang, Hsin-Chu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/345,806

(22) Filed: Nov. 8, 2016

(65) Prior Publication Data

US 2017/0140822 A1 May 18, 2017

Related U.S. Application Data (60) Provisional application No. 62/254,246, filed on Nov. 12, 2015.

(51) Int. Cl.
*G11C 15/00* (2006.01)
*G11C 15/04* (2006.01)
*G11C 7/06* (2006.01)

(52) U.S. Cl.
CPC ............. *G11C 15/04* (2013.01); *G11C 7/067* (2013.01); *G11C 2207/002* (2013.01)

(58) Field of Classification Search
CPC .................................................. G11C 15/04

USPC ................ 365/49.1, 49.16, 49.17, 51, 63
See application file for complete search history.

(56) References Cited

U.S. PATENT DOCUMENTS

| 6,999,331 | B2 | 2/2006 | Huang | |
|---|---|---|---|---|
| 7,570,093 | B1 | 8/2009 | Huang | |
| 8,837,188 | B1 * | 9/2014 | Krishnamurthy | .... G11C 15/046 365/49.1 |
| 9,063,840 | B1 * | 6/2015 | Deshpande | ......... G06F 12/0207 |
| 9,384,835 | B2 * | 7/2016 | Arsovski | ................ G11C 15/04 |
| 9,418,741 | B1 * | 8/2016 | Ramaraju | ............... G11C 15/00 |
| 2016/0218611 | A1 * | 7/2016 | Lollio | ................. H02M 3/1588 |

FOREIGN PATENT DOCUMENTS

| TW | 200418261 | 9/2004 |
|---|---|---|
| TW | 200941947 | 10/2009 |

* cited by examiner

*Primary Examiner* — Fernando Hidalgo
(74) *Attorney, Agent, or Firm* — McClure, Qualey & Rodack, LLP (57) ABSTRACT A sense amplifier circuit includes a single-ended sense amplifier and an isolation switch. The isolation switch is coupled between a bias node and a first line of a memory device, receives an output of the single-ended sense amplifier and selectively isolates the bias node and the first line in response to the output of the single-ended sense amplifier. The first line is coupled to a plurality of memory cells of the memory device.

20 Claims, 6 Drawing Sheets

SENSE AMPLIFIER CIRCUITS

CROSS REFERENCE TO RELATED APPLICATIONS

This application claims the benefit of U.S. Provisional Application No. 62/254,246 filed on Nov. 12, 2015 and entitled "Single Ended Sense Amplifier with NMOS Isolation Sensing Scheme" and the entire contents of which are hereby incorporated by reference.

BACKGROUND OF THE INVENTION

Field of the Invention

The invention relates to a sense amplifier circuit, and more particularly to a low power consumption sense amplifier circuit suitable for a ternary content addressable memory (TCAM) device or a single-ended bit line random access memory (RAM) device.

Description of the Related Art

Conventional content addressable memories (CAMs) can provide rapid matching between a specific pattern of received data bits, commonly known as a search key or comparand, and data values stored in a content addressable memory (CAM) array. In a CAM device, a CAM array can be searched in parallel. If a match occurs between each bit of a stored data value and a corresponding bit of an applied comparand, a match indication can be generated, via a match line, to indicate that the applied comparand is stored in the CAM. Data associated with the matching CAM location can then be returned. Thus, in a CAM device, a result can be determined from finding a matching value (content), and not from an address for a value, as is typically done for a random access memory (RAM).

However, power consumption in the search operation is huge compared to the read/write operation of a RAM since all match lines have to be activated to complete the search operation.

Therefore, a novel sense amplifier circuit to reduce power consumption is required.

BRIEF SUMMARY OF THE INVENTION

Sense amplifier circuits are provided. An exemplary embodiment of a sense amplifier circuit comprises a single-ended sense amplifier and an isolation switch. The isolation switch is coupled between a bias node and a first line of a memory device, receives an output of the single-ended sense amplifier and selectively isolates the bias node and the first line in response to the output of the single-ended sense amplifier. The first line is coupled to a plurality of memory cells of the memory device.

An exemplary embodiment of a sense amplifier circuit comprises a single-ended sense amplifier and an isolation switch. The single-ended sense amplifier comprises a first input terminal receiving a first pre-charge signal, a second input terminal coupled to a first line of a memory device and an output terminal coupled to an isolation switch. The isolation switch is coupled between a bias node and the first line, receives an output of the single-ended sense amplifier and selectively isolating the bias node and the first line in response to the output of the single-ended sense amplifier. The first line is coupled to a plurality of memory cells of the memory device.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1:
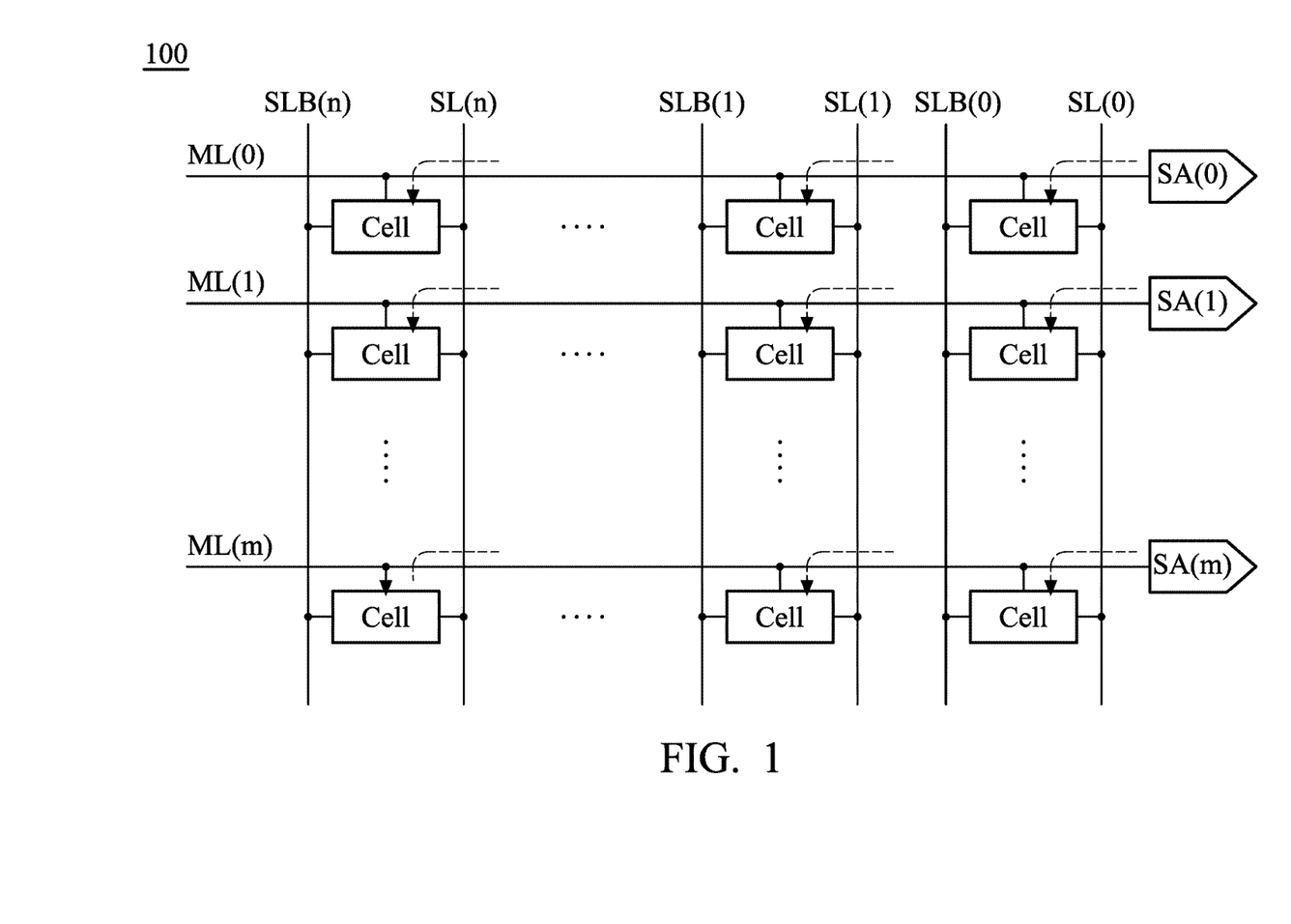
FIG. 1 is an exemplary block diagram of a memory device according to an embodiment of the invention.

FIG. 1 is an exemplary block diagram of a memory device according to an embodiment of the invention. The memory device 100 may be a ternary content addressable memory (TCAM) and may comprise a plurality of search lines, such as the search lines SL(0), SLB(0), SL(1), SLB(1), . . . SL(n) and SLB(n), a plurality of match lines, such as the match lines ML(0), ML(1), . . . and ML(m), a plurality of sense amplifiers coupled to the match lines, such as the sense amplifiers SA(0), SA(1), . . . and SA(m), and a plurality of memory cells each disposed at an intersection of a search line and a match line, where n and m are positive integers. The memory device 100 may further comprise a plurality of bit lines and a plurality of word lines (not shown), the bit lines and the search lines are parallel and the word lines and the match lines are parallel.

Note that FIG. 1 presents a simplified block diagram, in which only the elements relevant to the invention are shown. However, the invention should not be limited to what is shown in FIG. 1.

In a search operation, the search data is provided to the search lines and all the match lines are activated. The data stored in the memory cells is compared with the search data. When there is any bit miss, that is, the data stored in the memory cells on a match line does not match the search data, the voltage at the corresponding match line will be discharged via the memory cells in the direction shown by the arrows. Therefore, the output of the sense amplifier coupled to the corresponding match line is 0.

When there is 0-bit miss, that is, the data stored in the memory cells on a match line matches the search data, the voltage at the match line will be kept and will not be discharged. Therefore, the output of the sense amplifier coupled to the corresponding match line is 1.

Figure 2:
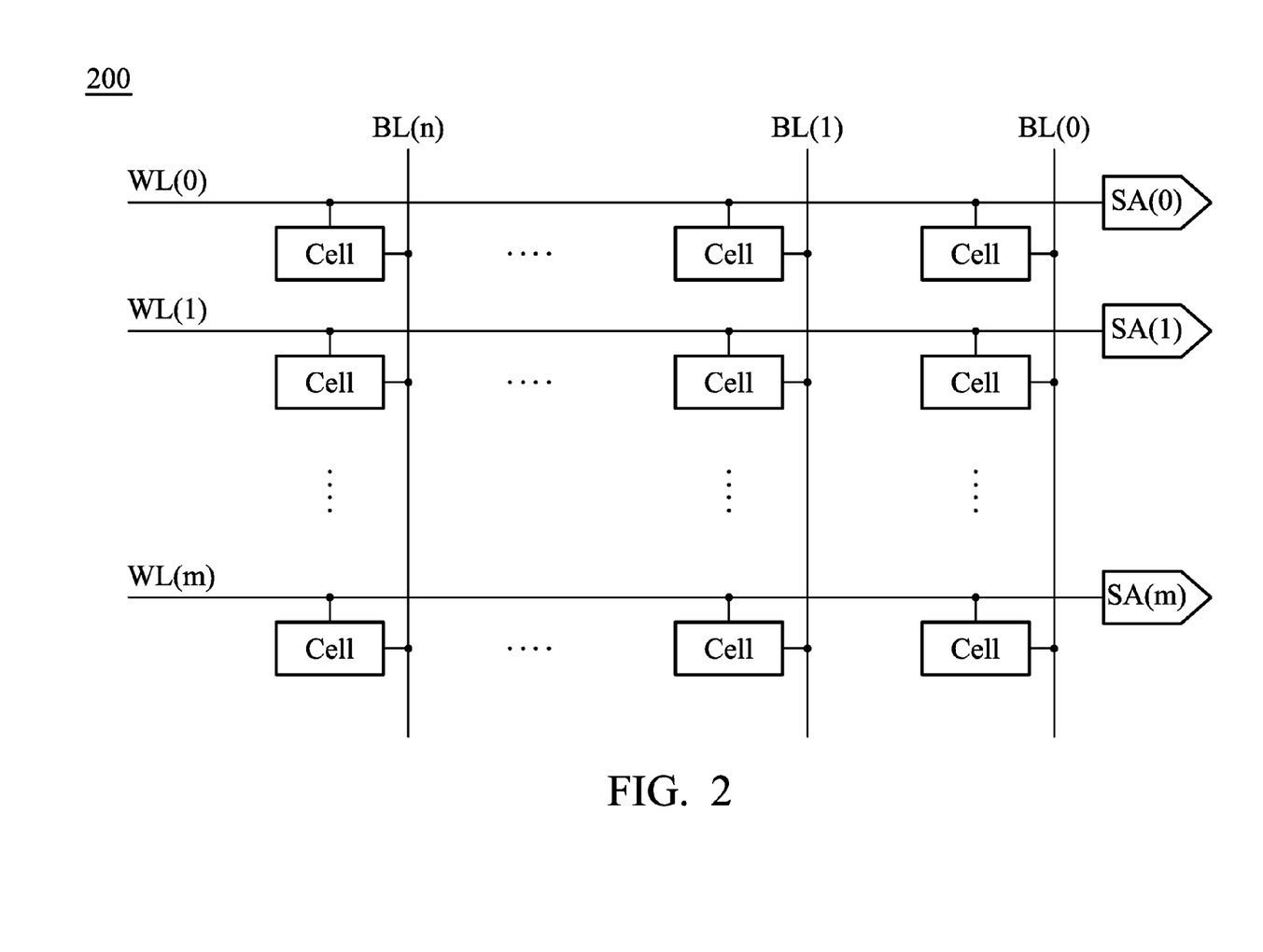
FIG. 2 is an exemplary block diagram of a memory device according to another embodiment of the invention.

FIG. 2 is an exemplary block diagram of a memory device according to another embodiment of the invention. The memory device 200 may be any type random access memory (RAM) device with single-ended bit line, and may comprise a plurality of bit lines, such as the bit lines BL(0), BL(1), . . . and BL(n), a plurality of word lines, such as the word lines WL(0), WL(1), . . . and WL(m), a plurality of sense amplifiers coupled to the word lines, such as the sense amplifiers SA(0), SA(1), . . . and SA(m), and a plurality of memory cells each disposed at an intersection of a bit line and a word line, where n and m are positive integers.

Note that FIG. 2 presents a simplified block diagram, in which only the elements relevant to the invention are shown. However, the invention should not be limited to what is shown in FIG. 2.

In the embodiments of the invention, structures of a novel low power consumption sense amplifier circuit are proposed. The power consumption of the proposed sense amplifier circuits is greatly reduced compared to the conventional designs. In addition, the proposed sense amplifier circuits can be applied in not only a TCAM device such as the memory device 100 shown in FIG. 1, but also can be applied in any single-ended bit line memory device, such as the memory device 200 shown in FIG. 2. In addition, the proposed sense amplifier circuits can also be applied in various single bit line semiconductor memory design, such as the content addressable memory (CAM), ROM, single-ended register and SRAM, The structures of the proposed sense amplifier circuits are discussed in more detail in the following paragraphs.

Figure 3:
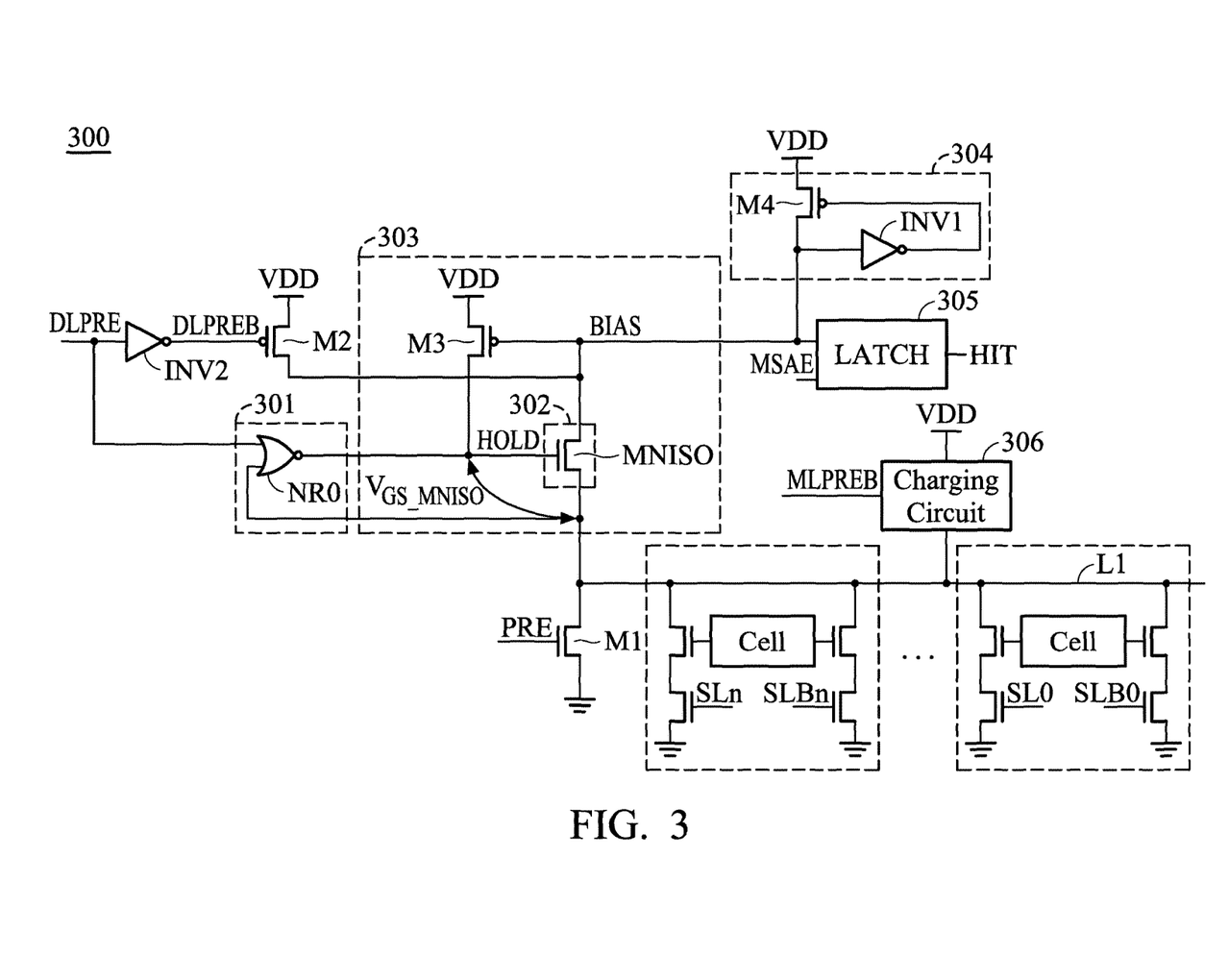
FIG. 3 is an exemplary diagram of a sense amplifier circuit according to an embodiment of the invention.

FIG. 3 is an exemplary diagram of a sense amplifier circuit 300 according to an embodiment of the invention. The sense amplifier circuit 300 may be any one of the sense amplifiers of the memory device 100 shown in FIG. 1, and may also be any one of the sense amplifiers of the memory device 200 shown in FIG. 2. The sense amplifier circuit 300 may comprise a single-ended sense amplifier 301 and an isolation switch 302. The isolation switch 302 is coupled between a bias node BIAS and a first line L1 of a memory device. The isolation switch 302 receives an output of the single-ended sense amplifier 301 and selectively isolates voltages at the bias node BIAS and the first line L1 in response to the output of the single-ended sense amplifier 301. Here, isolation means electronic isolation.

The first line L1 is coupled to a plurality of memory cells of the memory device. According to an embodiment of the invention, the first line L1 may be a match line or a bit line of the memory device.

According to an embodiment of the invention, the single-ended sense amplifier 301 may be a NOR gate NR0, and may comprise a first input terminal receiving a first pre-charge signal DLPRE, a second input terminal coupled to the first line L1 and an output terminal HOLD coupled to the isolation switch 302.

According to an embodiment of the invention, the isolation switch 302 may be a transistor MNISO comprising a first electrode coupled to the bias node BIAS, a second electrode coupled to the first line L1 and a control electrode coupled to the output terminal HOLD of the single-ended sense amplifier 301.

According to an embodiment of the invention, the sense amplifier circuit 300 may further comprise a transistor M1 coupled to the first line L1 and selectively being turned on for charging the first line L1 in response to a second pre-charge signal PRE. The transistor M1 may comprise a first electrode coupled to the first line L1, a second electrode coupled to the ground node to receive the supply power GND (having the ground voltage), and a control electrode receiving the second pre-charge signal PRE.

According to an embodiment of the invention, the sense amplifier circuit 300 may further comprise a transistor M2 coupled to the bias node BIAS and selectively being turned on for charging a voltage at the bias node BIAS in response to the first pre-charge signal DLPRE. The transistor M2 may comprise a first electrode coupled to a power supply to receive the supply power VDD (having the high voltage), a second electrode coupled to the bias node BIAS, and a control electrode receiving the first pre-charge signal DLPRE.

According to an embodiment of the invention, the sense amplifier circuit 300 may further comprise a transistor M3 coupled to the isolation switch 302 and the bias node BIAS. The transistor M3 and the isolation switch 302 may form a feedback loop 303 to hold a voltage at the output terminal HOLD of the single-ended sense amplifier 301. The transistor M3 may comprise a first electrode coupled to the power supply to receive the supply power VDD, a second electrode coupled to the output terminal HOLD of the single-ended sense amplifier 301 and a control electrode coupled to the bias node BIAS.

According to an embodiment of the invention, the sense amplifier circuit 300 may further comprise a keeper circuit 304 coupled between the bias node BIAS and the power supply and selectively keeping the voltage at the bias node BIAS. The keeper circuit 304 may comprise a transistor M4 and an inverter INV1. The transistor M4 comprises a first electrode coupled to the power supply to receive the supply power VDD, a second electrode coupled to the bias node BIAS and a control electrode. The inverter INV1 comprises an input terminal coupled to the bias node BIAS and an output terminal coupled to the control electrode of the transistor M4.

According to an embodiment of the invention, the sense amplifier circuit 300 may further comprise a latch circuit 305 coupled to the bias node BIAS and outputting the voltage at the bias node BIAS as an output signal HIT of the sense amplifier circuit 300 in response to a control signal MSAE.

According to an embodiment of the invention, the sense amplifier circuit 300 may further comprise a charging circuit 306. The charging circuit 306 is coupled to the power supply and the first line L1 and charges the first line L1 in response to a third pre-charge signal MLPREB.

Figure 4:
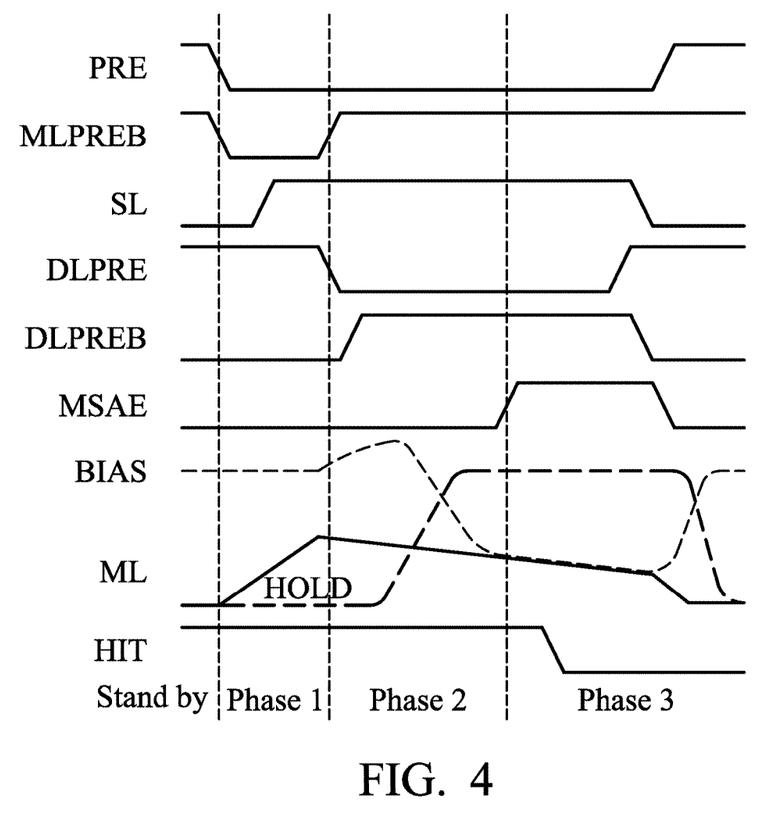
FIG. 4 shows signal waveforms of the sense amplifier circuit according to an embodiment of the invention.

FIG. 4 shows signal waveforms of the sense amplifier circuit according to an embodiment of the invention. Accompanying FIG. 3 and FIG. 4, operations of the sense amplifier circuit are illustrated in more detailed in the following paragraphs.

In a standby phase, the voltage level of the second pre-charge signal PRE is set to high and the voltage level of the first pre-charge signal DLPRE is set to high. Thereby, the transistor M1 is turned on in response to the second pre-charge signal PRE to pull down the voltage of the first line L1, and the transistor M2 is turned on in response to the first pre-charge signal DLPRE to pull up the voltage at the bias node BIAS. Since the voltage of the first line L1 is initially set to (or approaching) the ground voltage GND, a ground sensing scheme is implemented. In addition, since voltage level at the bias node BIAS is initially set to a high voltage (e.g. approaching the voltage of the supply power VDD), the transistor M4 in the keeper circuit 304 is turned on to keep the voltage at the bias node BIAS at a high voltage level. In addition, in the standby phase, since the voltage level of the first pre-charge signal DLPRE is high, the transistor MNISO in the isolation switch 302 is turned off to isolate the voltages at the bias node BIAS and the first line L1.

In the first phase Phase 1, the voltage level of the third pre-charge signal MLPREB goes low to enable the charging circuit 306 to charge the first line L1. The first line L1 is charged to a level equal to or above the input high voltage VIH of the NOR gate NR0. Note that since in the embodiments, the first line L1 is charged to the input high voltage VIH of the NOR gate NR0 instead of the voltage of the supply power VDD, the first line L1 is toggled in a small swing, not a full swing as in the conventional design. In addition, in the first phase Phase 1, since the voltage level of the first pre-charge signal DLPRE is high, the transistor MNISO in the isolation switch 302 is turned off to isolate the voltages at the bias node BIAS and the first line L1.

In the second phase Phase 2, which is an evaluation phase, the first pre-charge signal DLPRE goes low and the data stored in the memory cells is compared with the search data provided to the search lines. In the evaluation phase, the voltage level at the first line L1 may be kept high or pulled low, depending on the evaluation result.

For example, when the first line L1 is a match line and there is 0-bit miss (that is, the data stored in the memory cells on a match line matches the search data), the voltage level at the first line L1 will be kept high and will not be discharged. Since the voltage level at the first line L1 is still high, the transistor MNISO in the isolation switch 302 is turned off. In addition, the voltage level at the bias node BIAS is kept high. When the voltage level at the bias node BIAS is high, the transistor M4 in the keeper circuit 304 is turned on to keep the voltage at the bias node BIAS.

When there is any bit miss (that is, the data stored in the memory cells on a match line does not match the search data), the voltage at the corresponding match line will be discharged. Therefore, the voltage level at the first line L1 is pulled down as shown in FIG. 4. Since both the voltage level of the first pre-charge signal DLPRE and the voltage level at the first line L1 are low, the output of the single-ended sense amplifier at the output terminal HOLD goes high and the transistor MNISO in the isolation switch 302 is turned on to pull down the voltage level at the bias node BIAS as shown in FIG. 4.

The low voltage level at the bias node BIAS further turns on the transistor M3. The transistor M3 and the isolation switch 302 form a feedback loop 303 to hold the voltage at the output terminal HOLD of the single-ended sense amplifier 301 at a high voltage level.

In the third phase, Phase 3, which is an output phase, the control signal MSAE is asserted to enable the latch circuit 305 to output the voltage at the bias node BIAS as an output signal HIT of the sense amplifier circuit 300. For example, when the first line L1 is a match line and there is 0-bit miss, the voltage level of the output signal HIT is high. When there is any bit miss, the voltage level of the output signal HIT is low.

Figure 5:
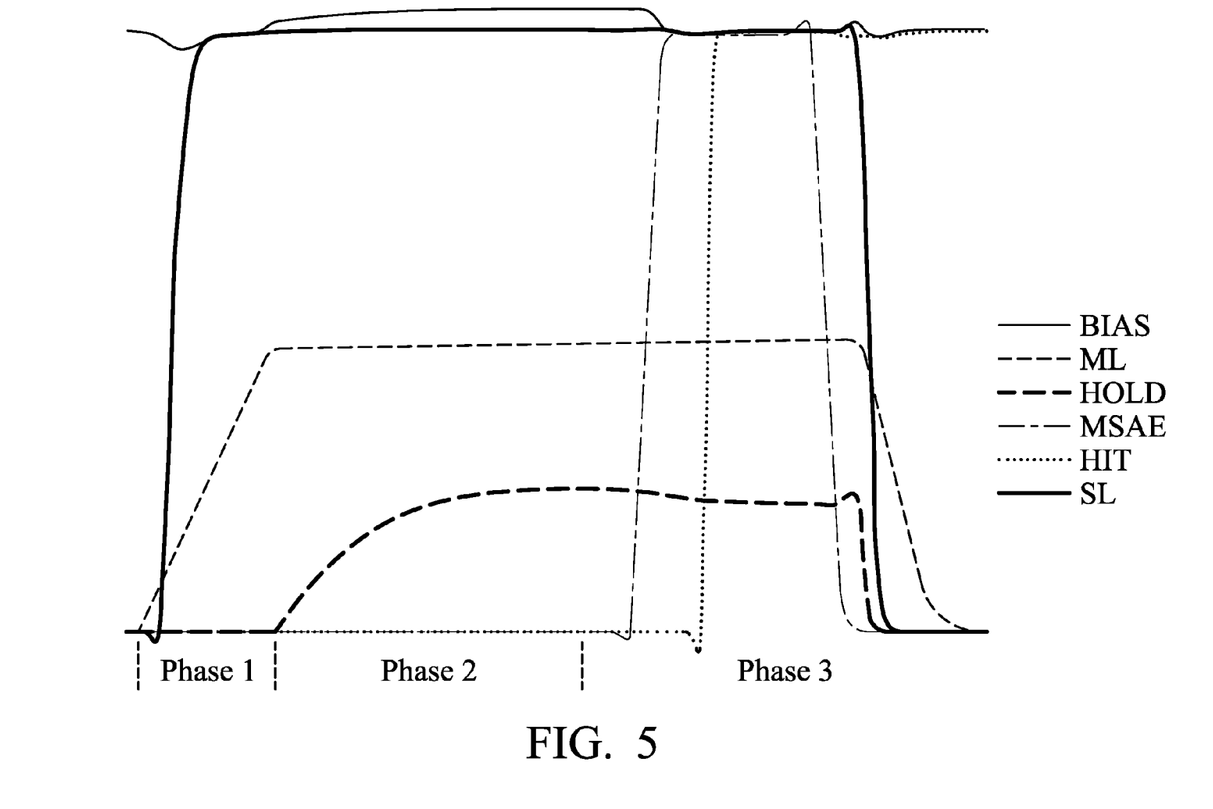
FIG. 5 is an exemplary simulation result showing the voltage levels on the search line SL, the match line ML, the output terminal HOLD, the bias node BIAS and the voltages levels of the control signal MSAE and the output signal HIT for a 0-bit miss case according to an embodiment of the invention.

FIG. 5 is an exemplary simulation result showing the voltage levels on the search line SL, the match line ML, the output terminal HOLD, the bias node BIAS and the voltages levels of the control signal MSAE and the output signal HIT for a 0-bit miss case according to an embodiment of the invention.

Figure 6:
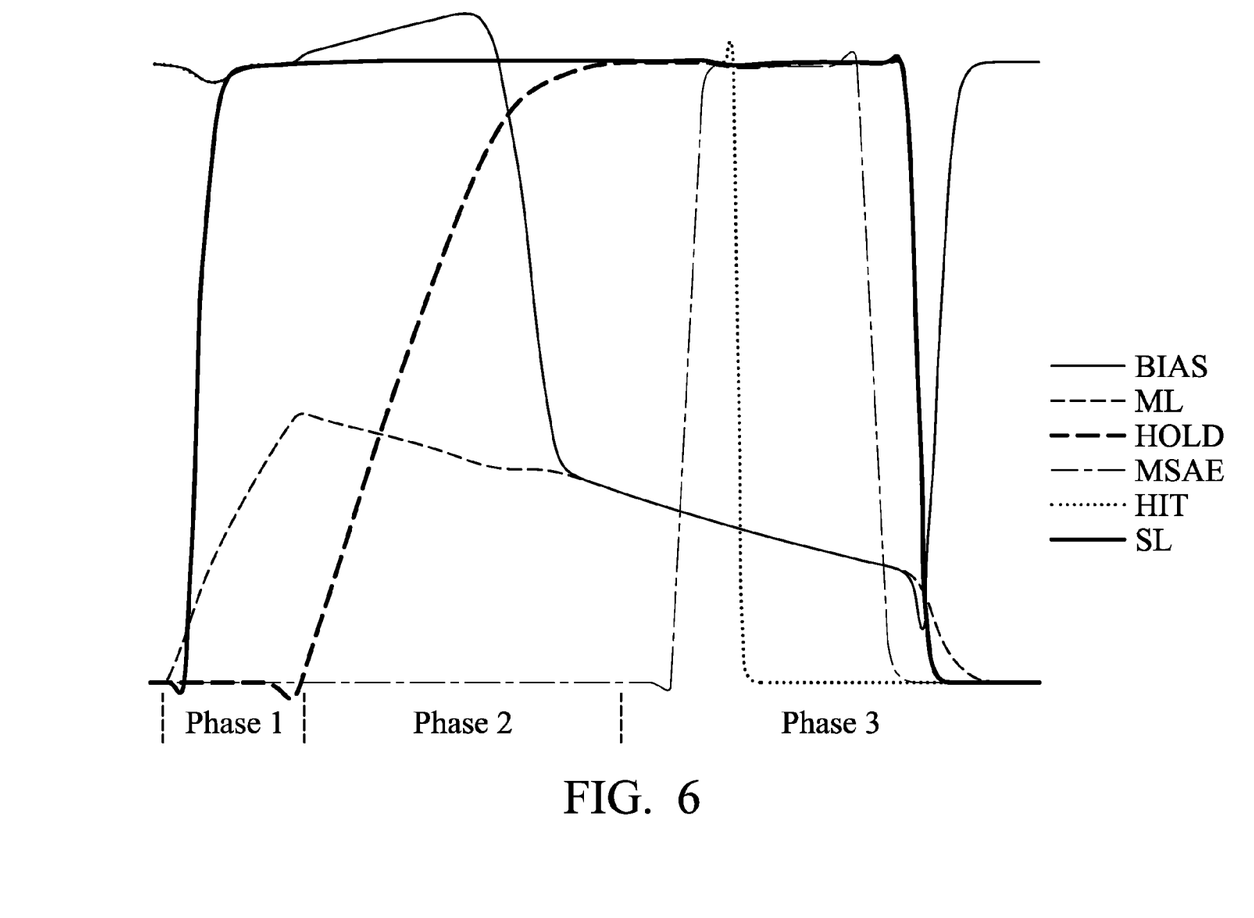
FIG. 6 is an exemplary simulation result showing the voltage levels on the search line SL, the match line ML, the output terminal HOLD, the bias node BIAS and the voltages levels of the control signal MSAE and the output signal HIT for a 1-bit miss case according to an embodiment of the invention.

FIG. 6 is an exemplary simulation result showing the voltage levels on the search line SL, the match line ML, the output terminal HOLD, the bias node BIAS and the voltages levels of the control signal MSAE and the output signal HIT for a 1-bit miss case according to an embodiment of the invention.

As shown in FIG. 5 and FIG. 6, comparing to the voltage level of the search line SL, which is toggled in a full swing, the match line ML is toggled in a small swing. Therefore, power consumption of the proposed sense amplifier circuit can be greatly reduced. In addition, since the first line L1 is pre-charged to the ground voltage GND, the leakage issue of the VDD sensing scheme in the conventional design can be avoided and the leakage power can be saved. In addition, since the transistor MNISO is applied to isolate the voltages at the bias node BIAS and the first line L1, the noise margin of the output signal HIT can be enlarged. In addition, since the feedback loop 303 is formed when the transistor M3 is turned on, noise susceptibility at the output terminal HOLD can be reduced, especially when there is only 1-bit miss (1-bit mismatch). In addition, the keeper circuit 304 keeps the voltage at the bias node BIAS when the transistor M4 is turned on, preventing the voltage at the bias node BIAS being discharged by the leakage in the case when the voltage level at the output terminal HOLD is low. In addition, as discussed above, the proposed sense amplifier circuits can be applied in not only a TCAM device such as the memory device 100 shown in FIG. 1, but also can be applied in any single-ended bit line memory device, such as the memory device 200 shown in FIG. 2. In addition, the proposed sense amplifier circuits can also be applied in various single bit line semiconductor memory design, such as the CAM, ROM, single-ended register and SRAM, While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A sense amplifier circuit, comprising:
    a single-ended sense amplifier;
    an isolation switch, coupled between a bias node and a first line of a memory device, receiving an output of the single-ended sense amplifier and selectively isolating the bias node and the first line in response to the output of the single-ended sense amplifier, wherein the first line is coupled to a plurality of memory cells of the memory device; and
    a first transistor, coupled to the isolation switch and the bias node,
    wherein the isolation switch is initially turned off to isolate voltages at the bias node and the first line, and
    wherein the first transistor and the isolation switch form a feedback loop to hold a voltage at an output terminal of the single-ended sense amplifier.

2. The sense amplifier circuit as claimed in claim 1, wherein the single-ended sense amplifier is a NOR gate comprising a first input terminal receiving a first pre-charge signal, a second input terminal coupled to the first line and an output terminal coupled to the isolation switch.

3. The sense amplifier circuit as claimed in claim 1, wherein the isolation switch is a transistor comprising a first electrode coupled to the bias node, a second electrode coupled to the first line and a control electrode coupled to an output terminal of the single-ended sense amplifier.

4. The sense amplifier circuit as claimed in claim 1, wherein the first line is a match line or a bit line of the memory device.

5. The sense amplifier circuit as claimed in claim 1, further comprising:

a second transistor, coupled to the first line and selectively being turned on for charging the first line in response to a second pre-charge signal.

6. The sense amplifier circuit as claimed in claim 1, further comprising:
a third transistor, coupled to the bias node and selectively being turned on for charging the voltage at the bias node in response to a first pre-charge signal.

7. The sense amplifier circuit as claimed in claim 1, wherein the first transistor comprises a first electrode coupled to a first power supply, a second electrode coupled to the output terminal of the single-ended sense amplifier and a control electrode coupled to the bias node.

8. The sense amplifier circuit as claimed in claim 1, further comprising:
a keeper circuit, coupled between the bias node and a first power supply and selectively keeping the voltage at the bias node.

9. The sense amplifier circuit as claimed in claim 8, wherein the keeper circuit comprises:
a fourth transistor, comprising a first electrode coupled to the first power supply, a second electrode coupled to the bias node and a control electrode; and
an inverter, comprising an input terminal coupled to the bias node and an output terminal coupled to the control electrode of the fourth transistor.

10. The sense amplifier circuit as claimed in claim 1, further comprising:
a latch circuit, coupled to the bias node and outputting the voltage at the bias node as an output signal in response to a control signal.

11. The sense amplifier circuit as claimed in claim 1, wherein the memory device is a single bit line semiconductor memory device.

12. A sense amplifier circuit, comprising:
a single-ended sense amplifier, comprising a first input terminal receiving a first pre-charge signal, a second input terminal coupled to a first line of a memory device and an output terminal coupled to an isolation switch;
the isolation switch, coupled between a bias node and the first line, receiving an output of the single-ended sense amplifier and selectively isolating the bias node and the first line in response to the output of the single-ended sense amplifier, wherein the first line is coupled to a plurality of memory cells of the memory device; and
a first transistor, coupled to the isolation switch and the bias node,
wherein the isolation switch is initially turned off to isolate voltages at the bias node and the first line, and
wherein the first transistor and the isolation switch form a feedback loop to hold a voltage at the output terminal of the single-ended sense amplifier.

13. The sense amplifier circuit as claimed in claim 12, wherein the first line is a match line or a bit line of the memory device.

14. The sense amplifier circuit as claimed in claim 12 further comprising:
a second transistor, coupled to the first line and selectively being turned on for charging the first line in response to a second pre-charge signal.

15. The sense amplifier circuit as claimed in claim 12, further comprising:
a third transistor, coupled to the bias node and selectively being turned on for charging the voltage at the bias node in response to the first pre-charge signal.

16. The sense amplifier circuit as claimed in claim 12, wherein the first transistor comprises a first electrode coupled to a first power supply, a second electrode coupled to the output terminal of the single-ended sense amplifier and a control electrode coupled to the bias node.

17. The sense amplifier circuit as claimed in claim 12, further comprising:
a keeper circuit, coupled between the bias node and a first power supply and keeping the voltage at the bias node.

18. The sense amplifier circuit as claimed in claim 12, further comprising:
a latch circuit, coupled to the bias node and outputting the voltage at the bias node as an output signal in response to a control signal.

19. The sense amplifier circuit as claimed in claim 1, wherein when voltage at the first line is initially set to a ground voltage and voltage at the bias node is initially set to a high voltage equal to or approaching voltage of a supply power, the isolation switch is turned off to isolate the voltages at the bias node and the first line.

20. The sense amplifier circuit as claimed in claim 12, wherein when voltage at the first line is initially set to a ground voltage and voltage at the bias node is initially set to a high voltage equal to or approaching voltage of a supply power, the isolation switch is turned off to isolate the voltages at the bias node and the first line.

* * * * *